United States Patent [19]

Fay et al.

[11] Patent Number: 4,750,079
[45] Date of Patent: Jun. 7, 1988

[54] LOW SIDE SWITCH INTEGRATED CIRCUIT

[75] Inventors: Gary Fay, Scottsdale; Steve McKinnis, Tempe; David H. Soo, Mesa, all of Ariz.

[73] Assignee: Motorola, Inc., Schaumburg, Ill.

[21] Appl. No.: 866,802

[22] Filed: May 27, 1986

[51] Int. Cl.⁴ .................................... H02H 3/08
[52] U.S. Cl. .................. 361/101; 361/87; 361/103; 361/98; 323/277
[58] Field of Search ............. 323/268, 269, 270, 271, 323/273, 274, 275, 276, 277; 361/18, 87, 93, 98, 101, 103

[56] References Cited

U.S. PATENT DOCUMENTS

| | | | |
|---|---|---|---|
| 3,480,852 | 11/1969 | Hung | 361/93 |
| 4,021,701 | 5/1977 | Davies | 361/103 X |
| 4,061,962 | 12/1977 | Stewart | 323/273 |
| 4,404,473 | 9/1983 | Fox | 361/98 X |
| 4,429,339 | 1/1984 | Jaeschke et al. | 361/93 |
| 4,493,002 | 12/1985 | Pelowski et al. | 361/93 |

Primary Examiner—A. D. Pellinen
Assistant Examiner—H. L. Williams
Attorney, Agent, or Firm—Joe E. Barbee

[57] ABSTRACT

An integrated circuit switch made with CMOS processes contains a high voltage, high current field effect output transistor. The output transistor serves as a switch and is connected in series with an external load which is to be controlled by the switch. The integrated circuit also contains over current protection circuits and over temperature protection circuits. A circuit also provides fault indications which can be used to determine whether the over current or the over temperature limits were exceeded to shut off the switch.

8 Claims, 1 Drawing Sheet

LOW SIDE SWITCH INTEGRATED CIRCUIT

CROSS REFERENCE TO RELATED APPLICATION

This application contains subject matter which is common to subject matter disclosed in patent application Ser. No. 866,805 U.S. Pat. No. 4,703,390 filed concurrently herewith.

BACKGROUND OF THE INVENTION

This invention relates, in general, to semiconductor integrated circuits, and more particularly, to a low side switch integrated circuit.

A very common device for switching power to a load has been the relay. However, one disadvantage of using relays for switching high currents to a load is that the contacts tend to pit and corrode which results in poor coupling of the current to the load. Another disadvantage is that contacts will tend to bounce when current is first applied or first removed. To overcome these disadvantages transistors have been used to switch the power to a load. More recently, the technology has advanced to a point to where field effect transistors can be used as switches. Field effect transistors are easily integrated and lend themselves to be easily controlled by MOS circuits.

Accordingly, it is an object of the present invention to provide an improved integrated circuit switch for controlling power to a load.

Another object of the present invention is to provide a single monolithic integrated circuit capable of switching power to a load in response to an analog or a digital input and having diagnostic circuitry available for fault indication.

Another object of the present invention is to provide an integrated circuit switch which has over current as well as over temperature limit indication.

SUMMARY OF THE INVENTION

The above and other objects of the present invention are provided by an integrated circuit having a field effect transistor for switching current to a load which is connected in series with the field effect transistor. Also provided are means for sensing current to the load which is amplified and then compared against a reference. If the current exceeds the reference, a fault notice is provided. The fault notice is also used to inhibit a control means which controls an enable signal to the field effect transistor.

The subject matter which is regarded as the invention is set forth in the appended claims. The invention itself, however, together with further objects and advantages thereof, may be understood by referring to the following detailed description taken in conjunction with the accompanying drawings.

DETAILED DESCRIPTION OF THE DRAWINGS

Figure 1:
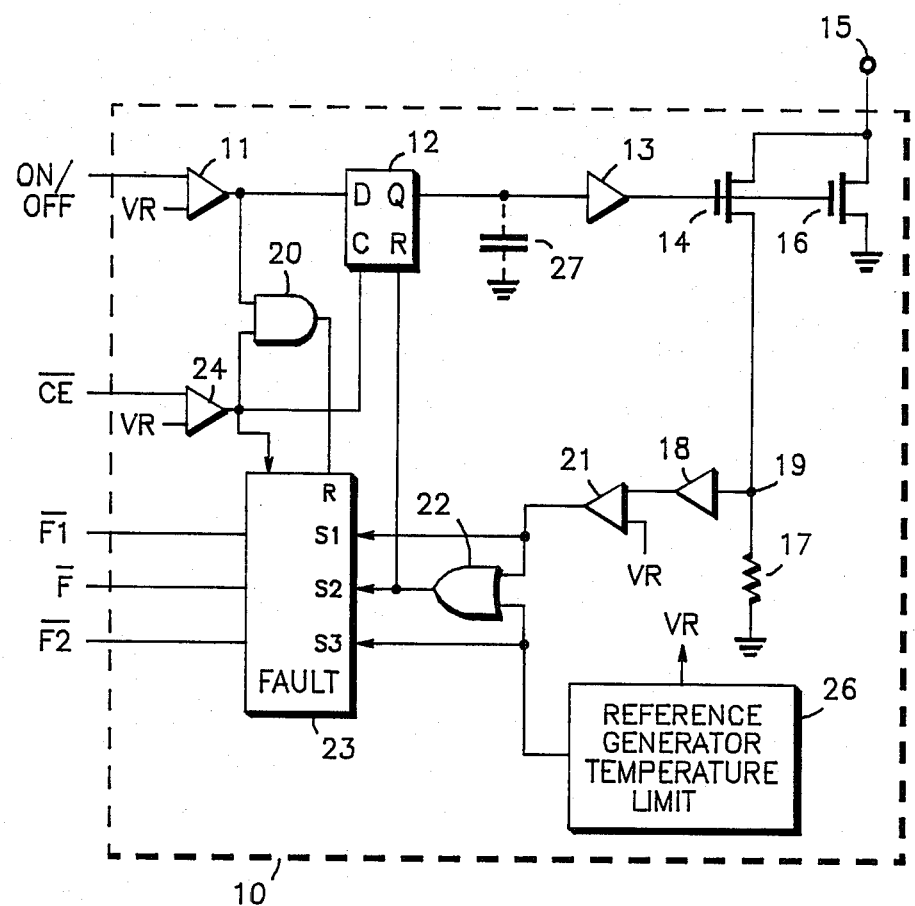
FIG. 1 illustrates, in block diagram form, the integrated circuit switch of the present invention.

FIG. 1 illustrates an integrated circuit 10 which uses CMOS circuitry to control a high voltage, high power MOS field effect transistor 16 which is connected as an open drain, grounded source. This configuration of field effect transistor 16 is commonly referred to as a low side switch since a switch (field effect transistor 16) is located in the return current path for the load, which is connected to terminal 15 in an operating circuit. The load would be connected between a power supply and terminal 15. Integrated circuit 10 receives an ON-OFF command which is connected to an input of a comparator 11. A second input of comparator 11 is connected to a reference voltage VR. The output of comparator 11 is connected to the D input of flip-flop 12. The Q output of flip-flop 12 is connected to a buffer driver 13. The output of buffer driver 13 is connected to the gate electrodes of field effect transistors 14 and 16.

In a preferred embodiment, transistor 14 can be a single cell or single transistor while transistor 16 can comprise more than a 1000 transistors all connected in parallel similar to transistor 14. The source electrode of transistor 16 is connected to ground while the source electrode of transistor 14 is connected to node 19. A current sense resistor is connected between node 19 and ground. Field effect transistor 14 and resistor 17 are in parallel with field effect transistor 16 and only a very small portion of the current flowing through the load connected to terminal 15 would flow through transistor 14 and resistor 17 which serve to sense current flow. The majority of the current flows through transistor 16. Resistor 17 is typically a small resistor on the order of 40 ohms. Accordingly, a very small voltage is developed at node 19 which is coupled to an amplifier 18. Amplifier 18 amplifies this small voltage at node 19 and outputs this amplified voltage to a comparator 21. Comparator 21 serves as an current limit comparator and also receives a reference voltage VR.

If the amplified signal from amplifier 18 exceeds the reference voltage VR, comparator 21 will toggle to provide an output which is connected to an input of a dual input OR gate 22. Optionally the output of comparator 21 is also connected to an input of fault circuitry 23. Connected to a second input of dual input OR gate 22 is an output from a temperature limit circuit which is a portion of reference voltage generator 26. In a preferred embodiment reference generator 26 is a bandgap voltage generator and provides a reference voltage output VR. Bandgap voltage generators made by a CMOS process are well known. One such bandgap voltage generator is disclosed in U.S. Pat. No. 4,287,439 which issued to Leuschner in September 1981. Another bandgap voltage generator which can be made by a CMOS process is disclosed in U.S. Pat. No. 4,380,706 which issued to Wrathall in April 1983.

OR gate 22 provides an output if over current comparator 21 toggles or if over temperature limit 26 senses a temperature in excess of a predetermined value. The predetermined value can be in the range of 135° C. in a preferred embodiment. The temperature sensed is the temperature of the die having integrated circuit 10 thereon. This temperature is approximately the same as the junction temperature of transistor 16 since everything is on the same die. Fault circuitry 23 uses the output of OR gate 22 to provide a composite failure or fault indication $\overline{F}$. The output of over temperature limit circuitry 26 can also be connected to fault circuitry 23 to cause fault circuitry 23 to generate an over temperature fault indication $\overline{F2}$. Fault circuitry 23 uses the output of over current comparator 21 to generate an over current fault indication $\overline{F1}$. Fault circuitry 23 has a latch on each input to latch the fault signal received. Each one of these latches is reset when both the ON/OFF input and the $\overline{CE}$ are present in a valid form. Both of these signals are ANDed by an AND gate 20 which provides a reset signal R to fault circuitry 23.

The output of OR gate 22 is also connected to the reset input of flip-flop 12. Therefore, when OR gate 22 provides an output due to an over current condition or over temperature condition, flip-flop 12 will be reset thereby removing the enabling signal from field effect transistors 14 and 16. Integrated circuit 10 also receives a chip enable not signal $\overline{CE}$ which is connected to an input of a comparator 24. A second input of comparator 24 is connected to reference voltage VR. The output of comparator 24 is connected to the clock input C of flip-flop 12. The output of comparator 24 is also used as a $\overline{CE}$ out signal which is connected to fault circuitry 23 to enable the output of the fault circuitry as will become more apparent hereinafter.

An optional embodiment will have the output of buffer driver 13 brought to an outside pin of integrated circuit 10 and the connection to the gate electrodes of transistors 14 and 16 will also be brought out to an outside pin. This will provide for the addition of a resistor or a resistor capacitor network to be used for controlling the switching speeds of transistors 14 and 16. This option is useful where slowing the operation of the transistors helps reduce noise and voltage spikes.

By now it should be appreciated that there has been provided an integrated circuit 10 which can be made totally by using CMOS processes. The ON-OFF input and the chip enable inputs are received by comparators in case these command signals operate in a voltage range which is not typically compatible with CMOS integrated circuit 10. Note that as illustrated, fault circuitry 23 can provided three different fault indications. If it is desired to package integrated circuit 10 in a small package having a limited number of interface pins then either composite fault signal $\overline{F}$ could be eliminated of if $\overline{F}$ is used then fault signals $\overline{F1}$ and $\overline{F2}$ could be eliminated. If fault signal $\overline{F}$ is eliminated then there would be no need for the connection from the output of OR gate 22 to fault circuit 23. Another option that can be provided on integrated circuit 10 is to connect node 19 to an outside pin so that an additional resistor can be connected in parallel with resistor 17 to thereby change the over current limit setting. It will be noted that if a chip enable signal is not required then a simple RS flip-flop could be used for flip-flop 12.

Figure 2:
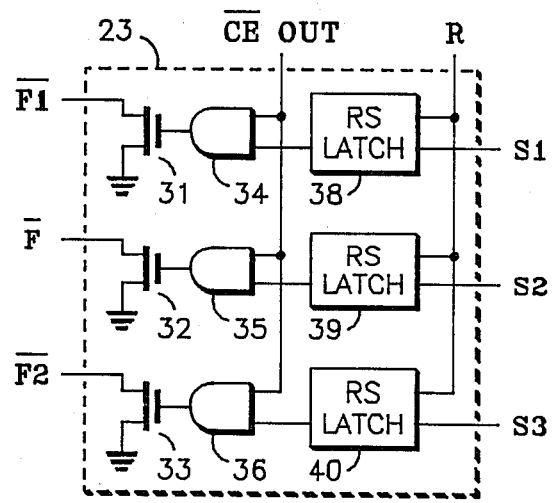
FIG. 2 illustrates the fault indicating circuitry of FIG. 1.

FIG. 2 illustrates, in schematic form, internal circuitry of one embodiment of fault circuit 23. Fault circuit 23 contains three open drain field effect transistors 31, 32, and 33. Each one of the transistors has its source connected to ground. The drain of transistor 31 is connected to fault indication $\overline{F1}$, the drain of transistor 32 is connected to $\overline{F}$, and the drain of transistor 33 is connected to $\overline{F2}$. The fault outputs are open drain field effect transistors capable of using various supply voltages and since the ON/OFF and $\overline{CE}$ signals require only TTL levels, any external interfacing device can be operated at any voltage level from TTL high to VDD.

The gate electrode of transistor 31 is connected to the output of an AND gate 34. One input of AND gate 34 receives $\overline{CE}$ out from the output of comparator 24; the other input of AND gate 34 is connected to the output of an RS latch 38. RS latch 38 receives a set input S1 from the output of comparator 21 and reset R from the output of AND gate 20. The gate electrode of transistor 32 is connected to the output of AND gate 35. AND gate 35 receives inputs $\overline{CE}$ out and the output of an RS latch 39. Latch 39 receives reset R and a set input S2 from the output of OR gate 22. The gate electrode of transistor 33 is connected to the output of AND gate 36. AND gate 36 receives $\overline{CE}$ out and the output from RS latch 40. RS latch 40 receives reset R and a set input S3 from the output of temperature limit 26.

We claim:

1. An integrated circuit having a current carrying field effect transistor serving as a switch for a load, comprising: current sensing means for current supplied to the load including another field effect transistor connected in series with a resistor; means for amplifying an output of the current sensing means to provide an amplified current sense signal; means for providing a voltage reference; a comparator for comparing the amplified current sense signal to a reference voltage provided by the means for providing a voltage reference, the comparator providing a fault output when the amplified sense current signal exceeds the reference voltage; and control means for controlling operation of the current carrying field effect transistor, the control menas responding to an on-off signal and to the fault output.

2. The integrated circuit of claim 1 wherein the means for providing the voltage reference is a bandgap voltage generator.

3. The integrated circuit of claim 1 further including a temperature limit sensing means for providing an over temperature output when a predetermined temperature is exceeded, and wherein the control means responds to the over temperature output.

4. The integrated circuit of claim 1 further including means for receiving a chip enable signal which is used to enable the control means.

5. An integrated circuit having a field effect transistor output for carrying current to a load, the field effect transistor being in the current return path of the load, the integrated circuit further comprising: a current sense field effect transistor in parallel with the current carrying field effect transistor, the current sense field effect transistor being for sensing current in the load; means for amplifying current helping to sense by the current sense field effect transistor; a bandgap voltage generator for generating a reference voltage; a current limit comparator for comparing the amplified current sensed to the reference voltage and providing an over current output when the amplified proportional voltage exceeds the reference voltage; means coupled to the current limit comparator for providing a fault signal; and means for latching an ON-OFF command and for providing an enabling signal to the field effect transistor carrying current to the load when an on command is received, the means for latching also terminating the enabling signal in response to an over current output coupled from the current limit comparator.

6. The integrated circuit of claim 5 further having temperature sensing means for providing an output when temperature exceeds a predetermined value, the means for latching being coupled to the temperature sensing means and inhibiting an enabling signal in response to the output from the temperature sensing means.

7. The integrated circuit of claim 5 further including means for coupling a chip enable signal to the means for latching to enable the means for latching.

8. The integrated circuit of claim 6 further including a logic gate to provide a composite fault signal, the logic gate being coupled to receive outputs from the temperature sensing means and from the current limit comparator.

* * * * *

UNITED STATES PATENT AND TRADEMARK OFFICE
CERTIFICATE OF CORRECTION

PATENT NO. : 4,750,079
DATED : June 7, 1988
INVENTOR(S) : Gary Fay et al.

It is certified that error appears in the above-identified patent and that said Letters Patent is hereby corrected as shown below:

Column 4, Claim 1, line 3, add "sensing" after -- for --.

Column 4, Claim 1, line 14, change "menas" to -- means --.

Column 4, Claim 5, line 7, change "sensing" to -- helping to sense --.

Column 4, Claim 5, line 8, change "helping to sense" to -- sensed --.

Signed and Sealed this

Twenty-fourth Day of January, 1989

*Attest:*

DONALD J. QUIGG

*Attesting Officer*  *Commissioner of Patents and Trademarks*